United States Patent
Uchiyama et al.

(10) Patent No.: US 8,427,917 B2
(45) Date of Patent: Apr. 23, 2013

(54) OPTICAL PICKUP APPARATUS, INTEGRATED CIRCUIT, AND METHOD FOR CONTROLLING LASER OUTPUT OF OPTICAL PICKUP APPARATUS

(75) Inventors: Hisayoshi Uchiyama, Gunma-ken (JP); Masashi Arai, Gunma-ken (JP); Hiroshi Kojima, Gunma-ken (JP); Rui Kurihara, Saitama-ken (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/422,242

(22) Filed: Mar. 16, 2012

(65) Prior Publication Data

US 2012/0236887 A1 Sep. 20, 2012

(30) Foreign Application Priority Data

Mar. 18, 2011 (JP) .................. 2011-060162

(51) Int. Cl.
*G11B 27/36* (2006.01)
*G11B 7/00* (2006.01)
*H01S 3/00* (2006.01)

(52) U.S. Cl.
USPC ............. 369/53.22; 369/44.41; 369/53.27; 369/124.12; 369/124.15; 372/38.02; 372/38.03

(58) Field of Classification Search ............. 369/124.12, 369/124.15, 44, 41, 53.22, 53.27, 53.35, 369/59.17; 372/38.02, 38.03
See application file for complete search history.

(56) References Cited

U.S. PATENT DOCUMENTS

| 2005/0053107 A1* | 3/2005 | Katada et al. | 372/38.07 |
| 2007/0248129 A1* | 10/2007 | Katada et al. | 372/38.02 |
| 2008/0144476 A1* | 6/2008 | Numata | 369/121 |

FOREIGN PATENT DOCUMENTS

JP 2003-132581 A 5/2003

* cited by examiner

*Primary Examiner* — Aneeta Yodichkas
(74) *Attorney, Agent, or Firm* — Osha Liang LLP

(57) ABSTRACT

An optical-pickup apparatus includes: a first laser light source including a first laser diode to emit a laser beam having a first wavelength, and a back-monitor photodetector to receive the laser beam emitted in a backward direction, not being an optical-disc direction, and output a first monitor signal; a second laser-light source including a second laser diode to emit a laser beam having a second wavelength; a light-receiving circuit including a front-monitor photodetector to receive the laser beam emitted in a forward direction, being the optical-disc direction, and output a second monitor signal, and a switch circuit to be inputted with the first and second monitor signals, and output the first or second monitor signal according to a switch signal; and first and second drive circuits to drive the first and second laser diodes according to the first and second monitor signals outputted from the light-receiving circuit, respectively.

3 Claims, 3 Drawing Sheets

OPTICAL PICKUP APPARATUS, INTEGRATED CIRCUIT, AND METHOD FOR CONTROLLING LASER OUTPUT OF OPTICAL PICKUP APPARATUS

CROSS-REFERENCE TO RELATED APPLICATION

This application claims the benefit of priority to Japanese Patent Application No. 2011-060162, filed Mar. 18, 2011, of which full contents are incorporated herein by reference.

BACKGROUND OF THE INVENTION

1. Field of the Invention

The present invention relates to an optical pickup apparatus, an integrated circuit, and a method for controlling laser output of an optical pickup apparatus.

2. Description of the Related Art

An optical pickup apparatus, configured to perform recording and reproducing signals for an optical disc, detects a laser beam emitted from a laser diode with a photodetector such as a photodiode, thereby controlling the output of the laser diode according to the intensity of the detected laser beam.

For example, Japanese Laid-Open Patent Publication No. 2003-132581 discloses, in FIG. 5, a back monitor type optical pickup apparatus configured to detect a laser beam emitted backward (which is not a direction of an optical disc) from a laser diode with a photodetector (back monitor photodetector) provided within the same package as that provided with the laser diode thereby controlling the drive current of the laser diode. For example, Japanese Laid-Open Patent Publication No. 2003-132581 discloses, in FIG. 4, a front monitor type optical pickup apparatus configured to detect a laser beam emitted forward (which is a direction of an optical disc) from a laser diode with a photodetector (front monitor photodetector) other than the back monitor photodetector thereby controlling the drive current of the laser diode.

FIGS. 3 and 4 respectively depict examples of configurations of typical laser output control circuits in the back monitor type optical pickup apparatus and the front monitor type optical pickup apparatus.

As depicted in FIG. 3, a back monitor photodiode (photodetector) PD1 receives a laser beam emitted backward from a laser diode LD1, and a current Ibm according to the intensity of the received laser beam flows through the photodiode PD1. Further, the current Ibm flows through a variable resistor VR adjusted depending on an optical disc, and a voltage Vbm generated across the variable resistor VR is converted into a digital signal by an ADC (analog-digital converter: analog-digital converter circuit) 12, and then inputted to an LD drive circuit 13. The LD drive circuit 13 controls a drive current Ild1 supplied from a power source 14 according to the voltage Vbm thereby controlling the output of the laser diode LD1.

Whereas, as depicted in FIG. 4, a front monitor photodiode PDfm receives a laser beam emitted forward from a laser diode LD2, and a current Ifm according to the intensity of the received laser beam flows through the photodiode PDfm. Further, the current Ifm is converted into a voltage signal Vfm by an IV amplifier (current/voltage converter circuit) 44, further converted into a digital signal by an ADC 22, and then inputted to an LD drive circuit 23. The LD drive circuit 23 controls a drive current Ild2 supplied from a power source 24 according to the voltage Vfm thereby controlling the output of the laser diode LD2. The IV amplifier 44 includes a plurality of resistors for selecting a gain and a switch circuit (not depicted) configured to switch a resistor to be connected, and the gain can be adjusted by inputting a selection signal SEL in accordance with an optical disc from a controller 50.

As such, the laser beam emitted from the laser diode is detected by the back monitor photodetector or the front monitor photodetector, thereby being able to control the output of the laser diode.

In the back monitor type laser output control circuit depicted in FIG. 3, the current Ibm, flowing through the photodiode PD1 provided within the same package as that provided with the laser diode LD1, is converted into the voltage Vbm using the variable resistor VR, to be used as a monitor signal indicative of the intensity of the laser beam. Therefore, the back monitor type enables inexpensive configuration of the laser output control circuit, and is mainly employed in an optical pickup apparatus configured to perform only reproducing operation.

On the other hand, in the front monitor type laser output control circuit depicted in FIG. 4, the current Ibm, flowing through the photodiode PDfm other than the photodiode PD2, is converted into the voltage Vfm using the IV amplifier 44, to be used as a monitor signal. The front monitor type enables faster response than that in the case of the back monitor type, and is therefore mainly employed in an optical pickup apparatus performs not only reproducing operation but also recording operation that requires high-speed control of the output of the laser diode.

By way of example, in an optical pickup apparatus that performs both recording and reproduction for CD (compact disc) and DVD (digital versatile disc) and performs only reproduction for BD (Blu-ray disc), a laser output control circuit for CD/DVD can be of the front monitor type and a laser output control circuit for BD can be of the back monitor type.

However, in the case of reproduction of a multilayer (two or more layer) BD, the output of the laser diode is required to be about 10 times greater than that in the case of reproduction of a single-layer BD. Therefore, in order to support reproduction of multilayer BD, the laser output control circuit depicted in FIG. 3 is required to use two variable resistors and adjust them depending on single-layer and multilayer BDs, respectively, and it is also required to further add a switch circuit that switches the two variable resistors.

SUMMARY OF THE INVENTION

An optical pickup apparatus according to an aspect of the present invention, includes: a first laser light source including a first laser diode configured to emit a laser beam having a first wavelength, and a back monitor photodetector configured to receive the laser beam emitted from the first laser diode in a backward direction, which is not a direction of an optical disc, and output a first monitor signal; a second laser light source including a second laser diode configured to emit a laser beam having a second wavelength; a light-receiving circuit including a front monitor photodetector configured to receive the laser beam emitted from the second laser diode in a forward direction, which is a direction of the optical disc, and output a second monitor signal, and a switch circuit configured to be inputted with the first and the second monitor signals, and output one of the first and the second monitor signals according to a switch signal; a first drive circuit configured to drive the first laser diode according to the first monitor signal outputted from the light-receiving circuit; and a second drive circuit configured to drive the second laser diode according to the second monitor signal outputted from the light-receiving circuit.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

===Configuration of Laser Output Control Circuit===

Description will hereinafter be given of a configuration of a laser output control circuit of an optical pickup apparatus according to an embodiment of the present invention with reference to FIGS. 1 and 2. In an embodiment of the present invention, by way of example, the optical pickup apparatus is configured to perform both recording and reproduction for CD and DVD and perform only reproduction for single-layer and multilayer BD.

Figure 1:
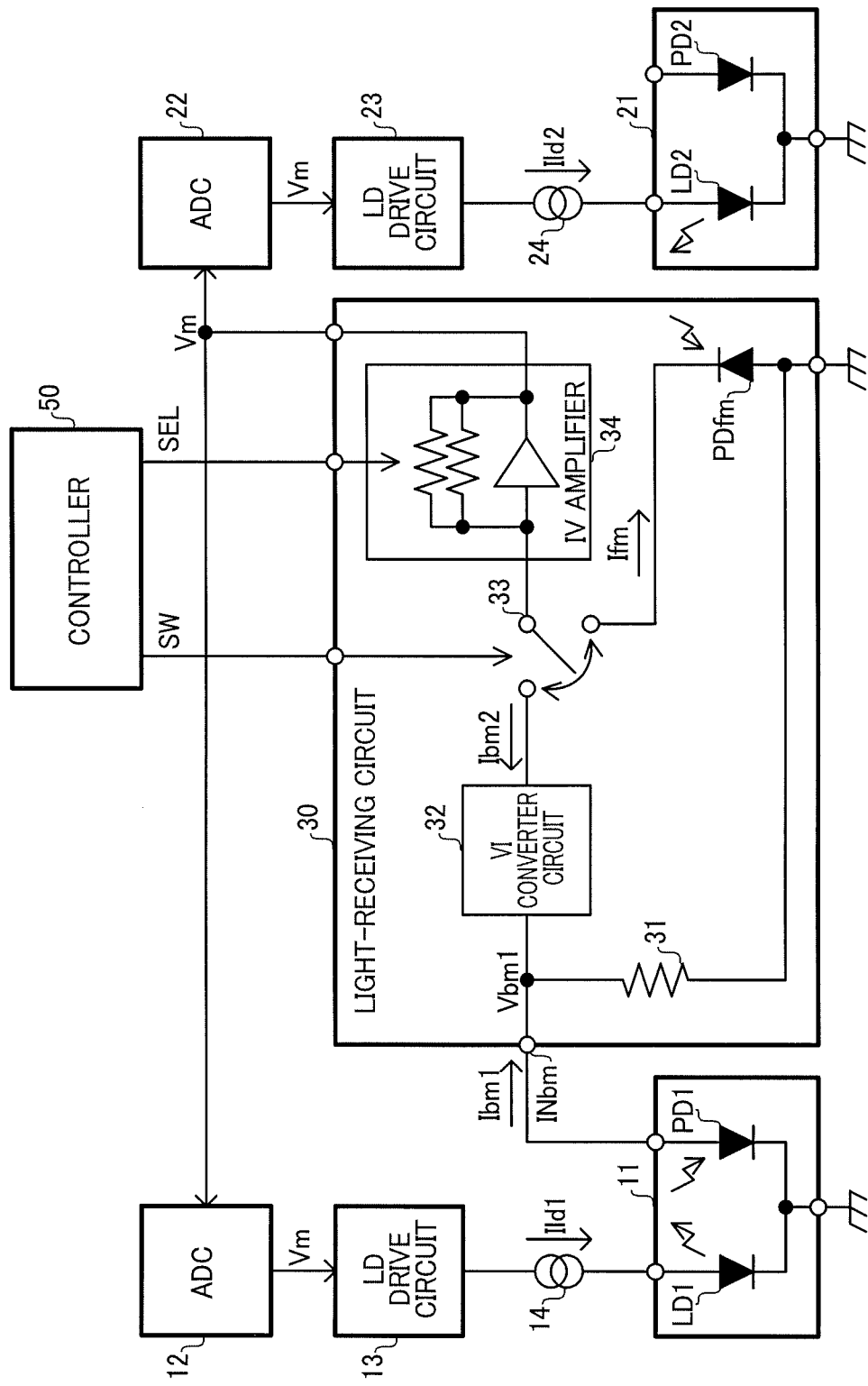
FIG. 1 is a circuit block diagram illustrating a configuration of a laser output control circuit of an optical pickup apparatus according to one embodiment of the present invention.

The laser output control circuit depicted in FIG. 1 is configured to control outputs of laser diodes LD1 and LD2, and includes photodiodes PD1, PD2, ADCs 12, 22, LD drive circuits 13, 23, current sources 14, 24, and a light-receiving circuit 30. The light-receiving circuit 30 is controlled by a controller 50.

The (first) laser diode LD1 is capable of emitting a blue-violet laser beam in the waveband of 405 nm, and is used for reproduction of BD. The laser diode LD1 and the photodiode PD1 are provided within the same package, configured as a (first) laser light source 11. The cathodes of the laser diode LD1 and the photodiode PD1 are connected to the common ground.

The (second) laser diode LD2 is capable of emitting an infrared laser beam in the waveband of 780 nm and a red laser beam in the waveband of 650 nm, and is used for recording/reproduction of CD/DVD. The laser diode LD2 and the photodiode PD2 are provided within the same package, configured as a (second) laser light source 21. The cathodes of the laser diode LD2 and the photodiode PD2 are connected to the common ground. The anode of the photodiode PD2 is in an open state.

The light-receiving circuit 30 includes a photodiode PDfm, a resistor 31, a VI (voltage/current) converter circuit 32, a switch circuit 33, and an IV amplifier 34, and is configured as an integrated circuit provided with at least a terminal INbm. The terminal INbm is connected to the anode of the photodiode PD1, and a current Ibm1 flowing through the photodiode PD1 is inputted via the terminal INbm to the light-receiving circuit 30.

The photodiode PDfm is disposed so as to receive the laser beam emitted forward (in a forward direction) from the laser diode LD2, and the anode thereof is connected to the ground. The resistor 31 has one end connected to the terminal INbm, and the other end connected to the ground.

Figure 2:
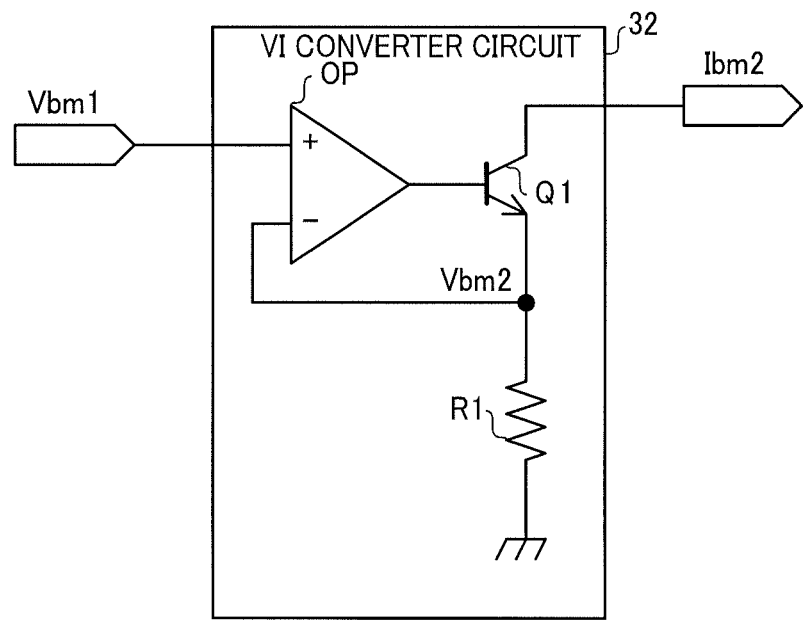
FIG. 2 is a circuit block diagram illustrating an example of a specific configuration of a VI converter circuit.
Figure 3:
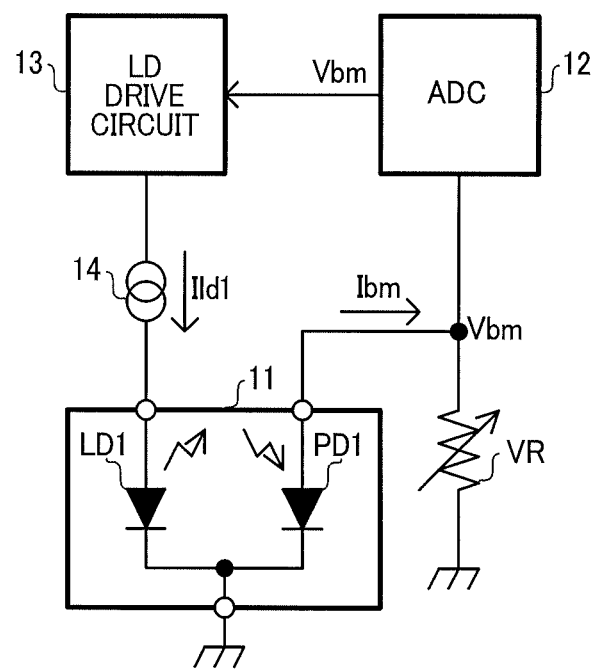
FIG. 3 is a circuit block diagram illustrating an example of a configuration of a typical laser output control circuit of back monitor type.
Figure 4:
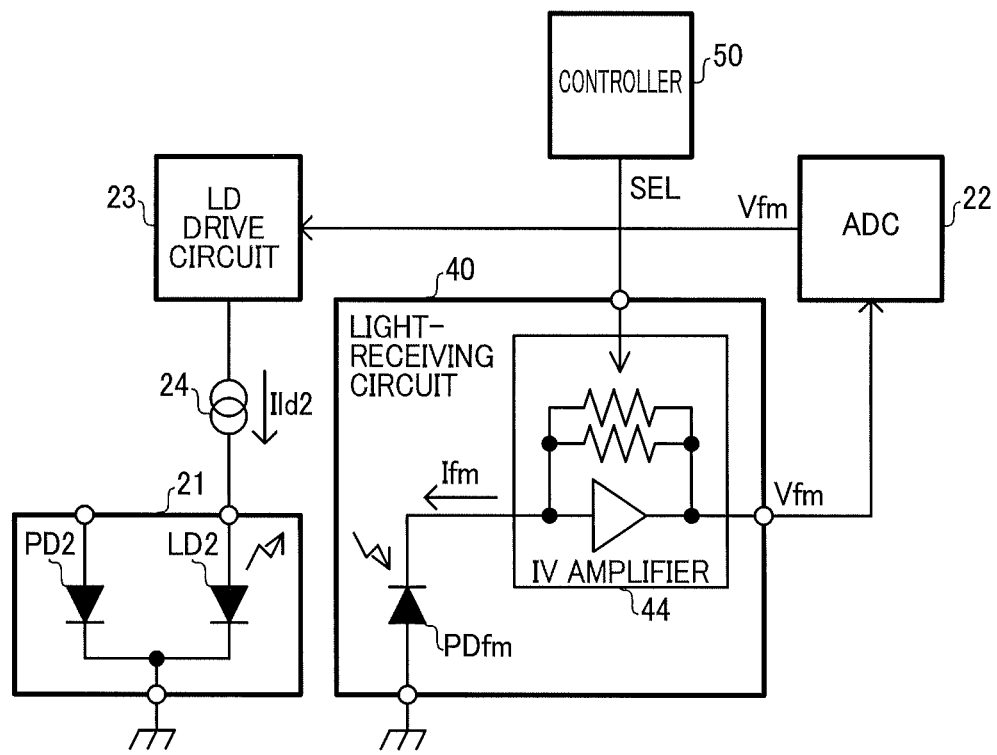
FIG. 4 is a circuit block diagram illustrating an example of a configuration of a typical laser output control circuit of front monitor type.

As depicted in FIG. 2, the VI converter circuit 32 includes an operational amplifier OP, a (NPN) transistor Q1, and a resistor R1. A voltage Vbm1 of the terminal INbm is applied to the non-inverting input of the operation amplifier OP, and the output thereof is connected to the base of the transistor Q1. The resistor R1 has one end connected to the emitter of the transistor Q1 and the other end thereof connected to the ground. Further, a voltage Vbm2 at a connection point between the transistor Q1 and the resistor R1 is applied to the inverting input of the operational amplifier OP. The collector of the transistor Q1 acts as an output node to output a current Ibm2.

The switch circuit 33 is configured to connect the input node of the IV amplifier 34 with the output node of the VI converter circuit 32 or the cathode of the photodiode PDfm. The current Ibm2 outputted from the VI converter circuit 32 or the current Ifm flowing through the photodiode PDfm is inputted via the switch circuit 33 to the IV amplifier 34. The switch circuit 33 is capable of switching the connection in response to a switch signal SW inputted from the controller 50.

The IV amplifier 34 can be configured using an operational amplifier whose inverting input and output are connected via resistors, for example, and a voltage signal Vm outputted from the IV amplifier 34 is inputted via the ADCs 12 and 22 to the LD drive circuits 13 and 23, respectively. The IV amplifier 34 includes a plurality of resistors for selecting a gain and a switch circuit (not depicted) configured to switch a resistor to be connected, and is capable of adjusting the gain according to a selection signal SEL inputted from the controller 50.

The LD drive circuit 13 (first drive circuit) is configured to control the current source 14, and the current source 14 is configured to supply a drive current Ild1 to the anode of LD1. The LD drive circuit 23 (second drive circuit) is configured to control the current source 24, and the current source 24 is configured to supply a drive current Ild2 to the anode of LD2.

===Operation of Laser Output Control Circuit===

Description will hereinafter be given of an operation of the laser output control circuit of the optical pickup apparatus according to an embodiment of the present invention.

Firstly, description will be given of an operation when performing recording/reproduction of CD/DVD. It should be noted that, when performing recording/reproduction of CD/DVD, the controller 50 is configured to input the switch signal SW to the switch circuit 33, thereby connecting the input node of the IV amplifier 34 and the cathode of the photodiode PDfm. The controller 50 is configured to input the selection signal SEL to the IV amplifier 34, thereby selecting a gain for CD or DVD as a gain of the IV amplifier 34.

When the drive current Ild2 is supplied from the current source 24 and the laser beam is emitted from the laser diode LD2, the photodiode PDfm receives the laser beam emitted forward from the laser diode LD2. The current Ifm according to the intensity of the received laser beam flows through the photodiode PDfm, and the current Ifm is inputted via the switch circuit 33 to the IV amplifier 34 as a sink current. In an embodiment of the present invention, the current Ifm corresponds to a second monitor signal.

The IV amplifier 34 is configured to convert the current Ifm into the voltage signal Vm according to the gain. The ADC 22 is configured to further convert the voltage signal Vm into a digital signal. The LD drive circuit 23 is configured to control the drive current Ild2 supplied from the current source 24 according to the voltage signal Vm converted into the digital signal, thereby controlling the output of the laser diode LD2.

As such, the current Ifm flowing through the front monitor photodiode PDfm of the light-receiving circuit 30 is converted into the voltage signal Vm using the IV amplifier 34 and used as the monitor signal, thereby being able to control the output of the laser diode LD2 at high speed and perform not only reproduction of CD/DVD but also recording thereof.

Secondly, description will be given of an operation when performing reproduction of single-layer or multilayer BD. When performing reproduction of BD, the controller 50 inputs the switch signal SW to the switch circuit 33, thereby connecting the input node of the IV amplifier 34 and the output node of the VI converter circuit 32. The controller 50 inputs the selection signal SEL to the IV amplifier 34, thereby selecting a gain for BD as a gain of the IV amplifier 34.

When the drive current Ild1 is supplied from the current source 14 and the laser beam is emitted from the laser diode LD1, the photodiode PD1 receives the laser beam emitted backward (in a backward direction) from the laser diode LD1. The current Ibm1 according to the intensity of the received laser beam flows through the photodiode PD1, and the current Ibm1 is inputted via the terminal INbm to the light-receiving circuit 30 as a source current. In an embodiment of the present invention, the current Ibm1 corresponds to a first monitor signal.

The current Ibm1 flows through the resistor 31 and the voltage (voltage of the terminal INbm) Vbm1 generated across the resistor 31 is inputted to the VI converter circuit 32. In the VI converter circuit 32 depicted in FIG. 2, the current Ibm2 (=Vbm1/R1) flows through the transistor Q1 so that the voltage Vbm1 and the voltage Vbm2 become equal to each other, and the current Ibm2 is inputted via the switch circuit 33 to the IV amplifier 34 as a sink current.

The IV amplifier 34 is configured to convert the current Ibm2 into the voltage signal Vm according to the gain. The ADC 12 is configured to further convert the voltage signal Vm into a digital signal. The LD drive circuit 13 is configured to control the drive current Ild1 supplied from the current source 14 according to the voltage signal Vm converted into the digital signal, thereby controlling the output of the laser diode LD1.

As such, when performing reproduction of BD, the current Ibm1 flowing through the back monitor photodiode PD1 provided in the laser light source 11 is converted into the voltage signal Vm using the resistor 31, the VI converter circuit 32, and the IV amplifier 34, and is used as the monitor signal. Although there is a difference, by about ten times, in magnitude of the output of the laser diode LD1 between the cases of reproduction of single-layer BD and reproduction of multilayer BD, as described above, a variable range of the IV amplifier 34 is sufficiently wide (e.g., 40 dB), thereby being able to support the reproduction of both types of BDs.

In an embodiment of the present invention, the current Ibm1 inputted as the source current is converted into the sink current Ibm2 in the same direction as that of the current Ifm, to be inputted to the switch circuit 33, using the resistor 31 and the VI converter circuit 32. Therefore, for example, in the case where the current Ibm1 and the current Ifm flow in the same direction such as when the cathode of the photodiode PDfm is connected to the ground, the resistor 31 and the VI converter circuit 32 are not necessary.

As described above, in the laser output control circuit of the optical output apparatus depicted in FIG. 1, the first monitor signal outputted from the back monitor photodiode PD1 is inputted to the light-receiving circuit 30 when performing reproduction of BD, and the switch circuit 33 switches the first monitor signal to the second monitor signal outputted from the front monitor photodiode PDfm included in the light-receiving circuit 30 when performing recording/reproduction of CD/DVD, thereby being able to support reproduction of multilayer BD without adjusting a variable resistor depending on single-layer and multilayer BDs.

Further, the current flowing through the photodiode PD1 or the photodiode PDfm is converted into the voltage signal Vm with the IV amplifier 34, and thus the LD drive circuits 13 and 23 are able to respectively control the outputs of the laser diode LD1 and LD2 according to the voltage signal Vm.

Further, the voltage Vbm1 generated across the resistor 31 through which the current Ibm1, flowing through the photodiode PD1, flows is converted into the current Ibm2, thereby being able to input the current Ibm2 and the current Ifm to the switch circuit 33 as the sink currents in the same direction.

Further, the light-receiving circuit (integrated circuit) 30 includes: the terminal INbm configured to inputted with the first monitor signal outputted from the back monitor photodiode PD1; the front monitor photodiode PDfm configured to output the second monitor signal; and the switch circuit 33 configured to switch the monitor signals, thereby being able to output, as the monitor signal, the first monitor signal when performing reproduction of BD and the second monitor signal when performing recording/reproduction of CD/DVD, respectively.

Further, using the light-receiving circuit (integrated circuit) 30, the first monitor signal is inputted to the terminal INbm when performing reproduction of BD, and a laser beam is received by the front monitor photodiode PDfm when performing recording/reproduction of CD/DVD, thereby being able to control each of the outputs of the laser diode LD1 and LD2 according to the monitor signal outputted from the light-receiving circuit (integrated circuit) 30, and therefore, reproduction of multilayer BD can be supported without adjusting a variable resistor depending on single-layer and multilayer BDs.

The above embodiments of the present invention are simply for facilitating the understanding of the present invention and are not in any way to be construed as limiting the present invention. The present invention may variously be changed or altered without departing from its spirit and encompass equivalents thereof.

What is claimed is:
1. An optical pickup apparatus comprising:
a first laser light source including
 a first laser diode configured to emit a laser beam having a first wavelength, and
 a back monitor photodetector configured to receive the laser beam emitted from the first laser diode in a backward direction, which is not a direction of an optical disc, and output a first monitor signal corresponding to a current signal flowing through the back monitor photodetector;
a second laser light source including a second laser diode configured to emit a laser beam having a second wavelength;
a light-receiving circuit including
 a front monitor photodetector configured to receive the laser beam emitted from the second laser diode in a forward direction, which is a direction of the optical disc, and output a second monitor signal corresponding to a current signal flowing through the front monitor photodetector, a switch circuit configured to be inputted with the first and the second monitor signals, and output one of the first and the second monitor signals according to a switch signal, a current/voltage converter circuit configured to convert into a voltage signal one of the first and the second monitor signals outputted from the switch circuit, and output the voltage signal, a resistor to which the first monitor signal is supplied, and a voltage/current converter circuit configured to convert a voltage generated across the resistor into a current signal in the same direction as a direction of the second monitor signal, and input the current signal to the switch circuit;

a first drive circuit configured to drive the first laser diode according to the first monitor signal outputted from the light-receiving circuit; and a second drive circuit configured to drive the second laser diode according to the second monitor signal outputted from the light-receiving circuit.

2. An integrated circuit comprising:

a terminal configured to be inputted with a first monitor signal outputted from a back monitor photodetector of a first laser light source, the first laser light source including a first laser diode configured to emit a laser beam having a first wavelength and the back monitor photodetector configured to receive the laser beam emitted from the first laser diode in a backward direction, which is not a direction of an optical disc, the first monitor signal corresponding to a current signal flowing through the back monitor photodetector;

a front monitor photodetector configured to receive a laser beam emitted from a second laser diode of a second laser light source in a forward direction, which is a direction of the optical disc, and output a second monitor signal, the second laser light source including the second laser diode configured to emit the laser beam having a second wavelength, the second monitor signal corresponding to a current signal flowing through the front monitor photodetector;

a switch circuit configured to be inputted with the first and the second monitor signals, and output one of the first and the second monitor signals according to a switch signal;

a current/voltage converter circuit configured to convert into a voltage signal one of the first and the second monitor signals outputted from the switch circuit, and output the voltage signal;

a resistor to which the first monitor signal is supplied; and a voltage/current converter circuit configured to convert a voltage generated across the resistor into a current signal in the same direction as a direction of the second monitor signal, and input the current signal to the switch circuit.

3. A method for controlling laser output of an optical pickup apparatus, comprising:

with respect to the integrated circuit of claim 2,
inputting the first monitor signal to the terminal;
causing the front monitor photodetector to receive the laser beam emitted from the second laser diode in the forward direction; and
controlling output of the first laser diode according to the first monitor signal outputted from the integrated circuit and controlling output of the second laser diode according to the second monitor signal outputted from the integrated circuit.

\* \* \* \* \*